United States Patent [19]

Schroeder

[11] Patent Number: 4,805,007

[45] Date of Patent: Feb. 14, 1989

[54] FLIP CHIP MODULE

[75] Inventor: Jack A. Schroeder, Scottsdale, Ariz.

[73] Assignee: Motorola Inc., Schaumburg, Ill.

[21] Appl. No.: 31,640

[22] Filed: Mar. 30, 1987

[51] Int. Cl.⁴ .................. H01L 21/447; H01L 23/12; H01L 23/04

[52] U.S. Cl. ........................ 357/74; 357/80; 357/79; 357/81

[58] Field of Search ............. 361/388, 413, 414, 420, 361/412, 398, 391, 340; 357/80, 68, 74, 72, 73, 81, 54, 79, 82; 174/52 FP, 68.5, 16 HS

[56] References Cited

U.S. PATENT DOCUMENTS

| | | | |
|---|---|---|---|
| 3,239,719 | 3/1966 | Shower | 357/81 |
| 4,007,479 | 2/1977 | Kowalski | 357/74 |
| 4,338,621 | 7/1982 | Braun | 357/74 |
| 4,563,725 | 1/1986 | Kirby | 361/388 |
| 4,692,790 | 9/1987 | Oyamada | 357/79 |

FOREIGN PATENT DOCUMENTS 0167355 12/1981 Japan ...................... 357/81

Primary Examiner—Andrew J. James
Assistant Examiner—S. V. Clark
Attorney, Agent, or Firm—Harry A. Wolin

[57] ABSTRACT

A flip chip module including a film having solder receptor pads and interconnect lines to which a plurality of electronic devices and the like are bonded. The film is folded at predetermined areas thereby decreasing the size of this multichip device. A removable heat radiating cover is disposed over the film. This cover allows for both heat dissipation and easy access internal components for both testing and replacement after the flip chip module has been assembled.

18 Claims, 2 Drawing Sheets

FLIP CHIP MODULE

BACKGROUND OF THE INVENTION

This invention generally pertains to a flip chip module. Generally in multichip electronic packages, it is desirable to be able to test and replace components within the package after the package has been assembled. This is due to the high cost of internal components and the inherent unreliability of the multichip devices. Further, it is desirable to have a multichip electronic package which may be disassembled and reassembled so that properly functioning components may be reused and non-operating components may be discarded.

It is extremely desirable for a multichip electronic package to be small in physical stature. A small package allows for more packages and devices to be utilized in a given space. Another problem inherent with small multichip packages is that the heat given off by the dice must be dissipated. Therefore, various types of heat sinks and the like must be employed. Existing multichip electronic packages are problematic in one or more of the above areas as well as being expensive and complicated to manufacture. The multichip electronic package of the present invention reduces the above problems and is simple and inexpensive to manufacture and produce.

SUMMARY OF THE INVENTION

The present invention pertains to a flip chip module which includes a film made out of a material such as polyimide having solder receptor pads and interconnect lines. Additionally, the film has folding areas which may or may not have means for stress relief so that the film may be folded. Dice are bonded on the film as are pin headers which serve as outward extending connectors. Once the dice and the pin headers are bonded to the film, the film is folded at the folding areas so that the dice are facing the opposite direction of the pin headers. A spring means is disposed in an interior space formed by the folding of the film. The spring means serves to keep the dice flush against either an insulating layer or a removable heat radiating cover which is placed over the folded film. The heat radiating cover may be removed and replaced thereby allowing easy access to the internal components of the flip chip module. Additionally, the heat radiating cover serves as a heat sink for the dice.

It is an object of the present invention to provide a new and improved flip chip module which is folded and requires a minimal amount of space.

It is a further object of the present invention to provide a new and improved flip chip module which may be manufactured at a low cost.

It is a further object of the present invention to provide a new and improved flip chip module which is easy to assemble.

It is a further object of the present invention to provide a new and improved flip chip module which may be tested and have parts replaced before final assembly.

It is a further object of the present invention to provide a new and improved flip chip module in which components may be replaced after final assembly.

These and other objects of this invention will become apparent to those skilled in the art upon consideration of the accompanying specification, claims, and drawings.

BRIEF DESCRIPTION OF THE DRAWINGS

Referring to the drawings, wherein like characters indicate like parts throughout the figures.

DESCRIPTION OF THE PREFERRED EMBODIMENTS

Figure 1:
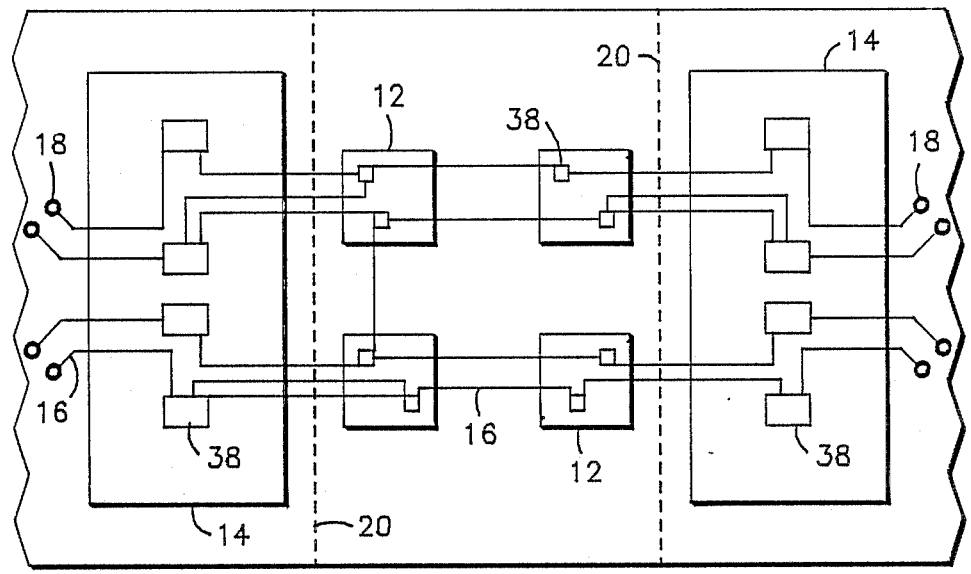
FIG. 1 is an enlarged top view of a simplified section of film of the type used in the present invention.
Figure 4:
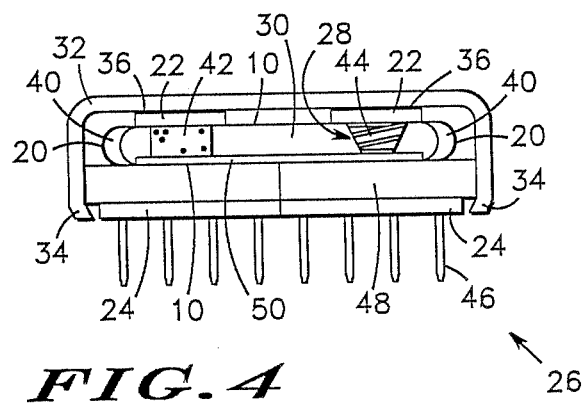
FIG. 4 is an enlarged cross sectional view of the flip chip module in the present invention.

Referring specifically to FIG. 1, an enlarged top view of a film, 10, of the type to be used in the present invention is shown. Commonly, film 10 is made of a polyimide material, however it should be understood that other materials may be used. Additionally, film 10 may be of various geometric shapes and should not be limited to the shape shown in the drawings. Film 10 is shown to have dice solder receptor pads, 12, as well as pin header solder receptor pads, 14. Film 10 also includes interconnect lines, 16. Interconnect lines 16 serve to connect solder receptor pads 12 and solder receptor pads 14 throughout film 10. Both solder receptor pads 12 and solder receptor pads 14 have bonding areas, 38, to which a plurality of dice, 22, (see FIG. 2) are electrically connected. Other electrical components may also be electrically connected. Interconnect lines 16 directly connect plurality of dice 22 to bonding areas 38 which further allow electrical connections between solder receptor pads 12 and 14 and plurality of dice 22. Also shown are plated through-holes, 18, which serve as terminals for interconnect lines 16. Plated through holes 18 may be placed randomly along interconnect lines 16 and depending on placement, may be used for testing before and/or after module assembly. For example, in the present placement (FIG. 1) holes 18 are used for testing prior to the assembly of FIG. 4. After testing, holes 18 and portions of lines 16 are removed so that pin headers 24 can be assembled in abutting engagement, as shown in FIG. 4. Film 10 may be folded at predetermined folding areas, 20. Folding areas 20 may include means for stress relief, 40, (See FIG. 4) thereby allowing for a better and more controlled fold. Means for stress relief 40 may include pliable metal strips bonded to film 10 at bonding areas 20 as well as other means.

Figure 2:
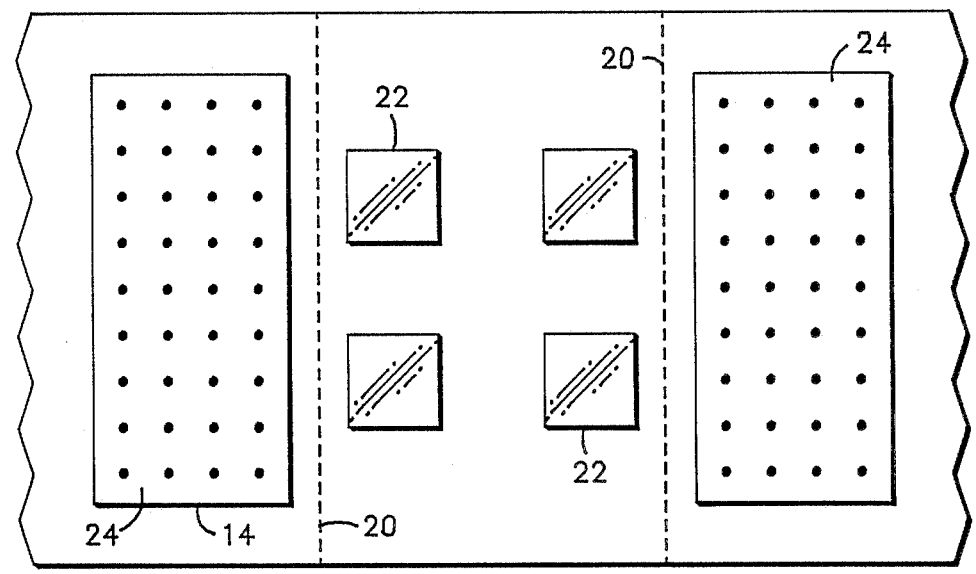
FIG. 2 is an enlarged top view of the film of FIG. 1 further comprising dice and pin headers.
Figure 3:
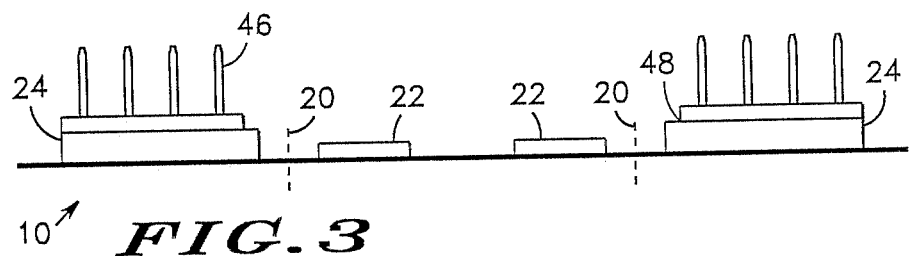
FIG. 3 is a side view of the film of FIG. 2 including the dice and pin headers.

Referring specifically to FIG. 2, an enlarged top view, and FIG. 3, an enlarged side view of the film of FIG. 1 further including plurality of dice 22 and a plurality of pin headers, 24, are shown. Pin headers 24 include a plurality of pins 46 and a base 48. It can be seen that folding areas 20 lie between dice 22 and pin headers 24. In this embodiment, once film 10 is folded dice 22 will face the opposite direction of pin headers 24. It should be understood however, that other configurations may be used.

Referring specifically to FIG. 4, a highly enlarged side view of a flip chip module, 26, is shown. Flip chip module 26 includes film 10, which has been folded at folding areas 20 between dice 22 and pin headers 24. Folded film 10 now having dice 22 and pin headers 24 facing opposite directions has compression spring means, 28, inserted in interior space, 30, which is formed as film 10 is folded. Compression spring means 28 may be a coil spring, 44, a resilient foam, 42, as well as other compressible materials. Although this embodiment shows both, it should be understood that commonly, only one of these types of compression spring means 28 is used in a single flip chip module 26. A spacer, 50, is also shown disposed in interior space 30. Spacer 50 is disposed between film 10 and spring means 28. Spring means 28 serves to keep dice 22 flush against a heat radiation cover, 32, which is disposed over folded film 10. Heat radiating cover 32 may be made of copper, aluminum or other materials having dissipating characteristics. Heat radiating cover 32 is held on flip chip module 26 by its crimped ends, 34. Heat radiating cover 32 is removable as shown thereby allowing easy access to internal components of flip chip module 26 such as dice 22. However, dice 22 may be epoxied to heat radiating cover 32. If this is done, heat radiating cover 32 will no longer be removable however, this does have various advantages. Shown in this embodiment, is an insulating layer, 36, which is disposed between a member of plurality of dice 22 and heat radiating cover 32. As shown, dice 22 may be selectively insulated depending upon the needs of a certain dice 22. In other words, certain numbers of plurality dice 22 may be insulated while others are not. Additionally, although this embodiment of flip chip module 26 is hermetically sealed, it does not have to be.

Thus, it is apparent that there has been provided in accordance with the invention, a new and improved flip chip module which meets the objects and advantages set forth above. While we have shown and described specific embodiments of this invention, further modifications and improvements will occur to those skilled in the art. We desire to be understood, therefore, that this invention is not limited to the particular form shown and we intend in the appended claims to cover all modifications which do not depart from the spirit and scope of this invention.

What is claimed is:

1. A flip chip module comprising:
   a film having solder receptor pads and interconnect lines, said film further, having folding areas;
   a plurality of dice bonded to specific ones of said solder receptor pads;
   a plurality of pin headers bonded to specific ones of said solder receptor pads;
   a heat radiating cover for covering said film including said plurality of dice, said film being folded at said folding areas and disposed within said heat radiating cover; and
   compressible means for holding said plurality of dice in contact with said heat radiating cover.

2. The flip chip module of claim 1 wherein the film is comprised of a polyimide material.

3. The flip chip module of claim 1 further comprising plated through-holes at various points along the interconnect lines.

4. The flip chip module of claim 1 having means for stress relief in the folding areas of the film.

5. The flip chip module of claim 1 wherein the plurality of dice and the plurality of pin headers face opposite directions after the film has been folded at the folding areas.

6. The flip chip module of claim 1 further comprising an insulating layer disposed between at least some of the plurality of dice and the heat radiating cover.

7. The flip chip module of claim 1 wherein the heat radiating cover is removable.

8. The flip chip module of claim 1 wherein the heat radiating cover is comprised of copper.

9. The flip chip module of claim 1 wherein the heat radiating cover is comprised of aluminum.

10. The flip chip module of claim 1 wherein compressable means includes a coil spring.

11. The flip chip module of claim 1 wherein compressable means includes a resilient foam.

12. The flip chip module of claim 1 wherein the plurality of dice are one of epoxied and bonded to said heat radiating cover.

13. The flip chip module of claim 1 wherein said flip chip module is hermetically sealed.

14. A flip chip module comprising:
   a polyimide film having solder receptor pads, interconnect lines and plated through-holes, said film further having folding areas including stress relief means;
   a plurality of dice bonded to specific ones of said solder receptor pads;
   a plurality of pin headers bonded to specific ones of said solder receptor pads;
   a removable metal heat radiating cover for covering said film including said plurality of dice, after said film has been folded at said folding areas;
   an insulating layer disposed between said plurality of dice and said metal heat radiating cover; and
   spring means for retaining said plurality of dice flush against said insulating layer and in turn, keeping said insulating layer flush against said metal heat radiating cover.

15. The flip chip module of claim 14 wherein the plurality of dice and the plurality of pin headers face opposite direction after the film has been folded at the folding areas.

16. The flip chip module of claim 14 wherein the spring means is a coil spring.

17. The flip chip module of claim 14 wherein the spring means is a resilient foam.

18. The flip chip module of claim 14 wherein said flip chip module is hermetically sealed.

* * * * *